US006974950B2

(12) United States Patent
Leung et al.

(10) Patent No.: US 6,974,950 B2
(45) Date of Patent: *Dec. 13, 2005

(54) POSITIVE AND NEGATIVE ION BEAM MERGING SYSTEM FOR NEUTRAL BEAM PRODUCTION

(75) Inventors: Ka-Ngo Leung, Hercules, CA (US); Jani Reijonen, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/232,503

(22) Filed: Aug. 30, 2002

(65) Prior Publication Data

US 2003/0042411 A1 Mar. 6, 2003

Related U.S. Application Data

(60) Provisional application No. 60/316,790, filed on Aug. 31, 2001.

(51) Int. Cl.[7] .............................................. H01J 37/08
(52) U.S. Cl. .................. 250/251; 250/423 R; 250/424; 313/111.61; 313/111.81; 313/359.1; 313/363.1
(58) Field of Search .......................... 250/251, 423 R, 250/424

(56) References Cited

U.S. PATENT DOCUMENTS

| | | | | |
|---|---|---|---|---|
| 3,116,433 A | * | 12/1963 | Moncrieff-Yeates | ... 315/111.01 |
| 3,846,636 A | * | 11/1974 | Zehr et al. | ... 376/156 |
| 4,395,631 A | * | 7/1983 | Salisbury | ... 250/251 |
| 4,447,732 A | | 5/1984 | Leung et al. | |
| 4,447,761 A | * | 5/1984 | Stinnett | ... 315/111.81 |
| 4,529,571 A | * | 7/1985 | Bacon et al. | ... 376/144 |
| 4,749,857 A | * | 6/1988 | Druaux | ... 250/251 |
| 4,793,961 A | * | 12/1988 | Ehlers et al. | ... 376/127 |
| 4,847,504 A | * | 7/1989 | Aitken | ... 250/492.2 |
| 4,894,199 A | * | 1/1990 | Rostoker | ... 376/107 |
| 5,198,677 A | | 3/1993 | Leung et al. | |
| 6,094,012 A | | 7/2000 | Leung et al. | |
| 2002/0134939 A1 | * | 9/2002 | Giedd | ... 250/338.1 |
| 2002/0150193 A1 | * | 10/2002 | Leung et al. | ... 376/108 |

OTHER PUBLICATIONS

Aberth et al., "Ion-Ion Mutual Neutralization Cross Sections Measured by a Superimposed Beam Technique", Jan. 5, 1970, Physical Review, vol. 1, pp. 158-165.*
Aberth et al., "Ion-Ion Mutual Neutralization Cross Sections Measured by Superimposed Beam Technique", Jan. 5, 1970, Physical Review, vol. 1, No. 1, pp 158-165.*

(Continued)

Primary Examiner—Nikita Wells
Assistant Examiner—Christopher M. Kalivoda
(74) Attorney, Agent, or Firm—Joseph R. Milner

(57) ABSTRACT

The positive and negative ion beam merging system extracts positive and negative ions of the same species and of the same energy from two separate ion sources. The positive and negative ions from both sources pass through a bending magnetic field region between the pole faces of an electromagnet. Since the positive and negative ions come from mirror image positions on opposite sides of a beam axis, and the positive and negative ions are identical, the trajectories will be symmetrical and the positive and negative ion beams will merge into a single neutral beam as they leave the pole face of the electromagnet. The ion sources are preferably multicusp plasma ion sources. The ion sources may include a multi-aperture extraction system for increasing ion current from the sources.

9 Claims, 6 Drawing Sheets

OTHER PUBLICATIONS

Lomer, P.D.;Bounden, J.E.; Wood, J.D.L.H., "High Output Neutron Generating Tubes," CONF-650405-2. Services Electronics Rsrch Lab (Baldock, England), p. 623-34, (Sep. 1, 1964).

Eyrich, W.; Schmidt, A., "Two Compact, High-Intensity Pulsed Neutron Sources," Tehnical Report No. KFK-304: SM-62/4; SM-62/4, Federal Republic of Germany (Germany), p. 589-608, (May 1, 1965).

Lomer, P.D.;Bounden, J.E.; Wood, J.D.L.H., "A Neutron Tube with Constant Output," Nucl. Instr. Methods, Services Electronics Resrch Lab (Baldock, England), p. 283-288, (Mar. 1, 1965).

* cited by examiner

POSITIVE AND NEGATIVE ION BEAM MERGING SYSTEM FOR NEUTRAL BEAM PRODUCTION

RELATED APPLICATIONS

This application claims priority of Provisional Application Ser. No. 60/316,790 filed Aug. 31, 2001.

GOVERNMENT RIGHTS

The United States Government has rights in this invention pursuant to Contract No. DE-AC03-76SF00098 between the United States Department of Energy and the University of California.

BACKGROUND OF THE INVENTION

The invention relates generally to particle beam systems, and more particularly to neutral beam systems.

In many applications, such as ion implantation or neutral beam injection into a fusion device, either positive or negative ion beams are employed. In either case, there are limitations in which either positive or negative ion beams will encounter some technical difficulties. In ion implantation, low energy (about 500 eV) $B^+$ or $P^+$ ion beams are needed for making shallow junctions. At such low energies, the transport of positive ion beams with reasonable currents are difficult because space charge force will cause the beam to blow up before it arrives at the target. One possible solution is to use a solenoid magnetic field to guide the low energy beam. Another possible solution is to employ plasma immersion ion implantation techniques. In either case, one has to make a radical change in implanter design.

In the case of high energy neutral beam injection in a fusion device, negative $D^-$ ions are normally employed. They are accelerated to energies higher than 500 keV and then neutralized before entering into the fusion device. Neutral beams are needed because the neutral particles can penetrate the strong confining magnetic field of fusion device without any deflection. The $D^-$ ions are extracted from an ion source and are accelerated to high energy by an electrostatic or radio-frequency acceleration system. The ions then pass through a gas or plasma neutralizer. For a gas neutralizer, less than 60% of the beam will be converted into neutral particles. The un-neutralized part of the beam will constitute a power loss.

Accordingly it is desirable to provide a neutral beam formation process and apparatus that reduces or eliminates the problems of beam blowup at low energy beam transport and the large amount of unneutralized beam in high energy beam formation.

SUMMARY OF THE INVENTION

In the positive and negative ion beam merging system of the invention, positive and negative ions of the same species and of the same energy are respectively extracted from two separate ion sources. In the case of fusion applications, $D^+$ and $D^-$ ions (or $T^+$ and $T^-$) are extracted from the two sources. In ion implantation applications, $B^+$ and $B^-$ or $P^+$ and $P^-$ or other compound ions such as $BF^+$ and $BF^-$ or $BF_2^+$ and $BF_2^-$ are employed.

The positive and negative ions from both sources pass through a bending magnetic field region between the pole faces of an electromagnet. The positive and negative ions come from mirror image positions on opposite sides of a beam axis. Since the masses of the positive and negative ions are identical, they will have the same Larmor radii under the same beam energy and magnetic field, i.e. the trajectories will be symmetrical and the positive and negative ion beams will merge into a single neutral beam as they leave the pole face of the electromagnet.

The ion sources used to implement the invention are preferably multicusp plasma ion sources. The ion sources may include a multi-aperture extraction system for increasing ion current from the source.

DETAILED DESCRIPTION OF THE INVENTION

Figure 1:
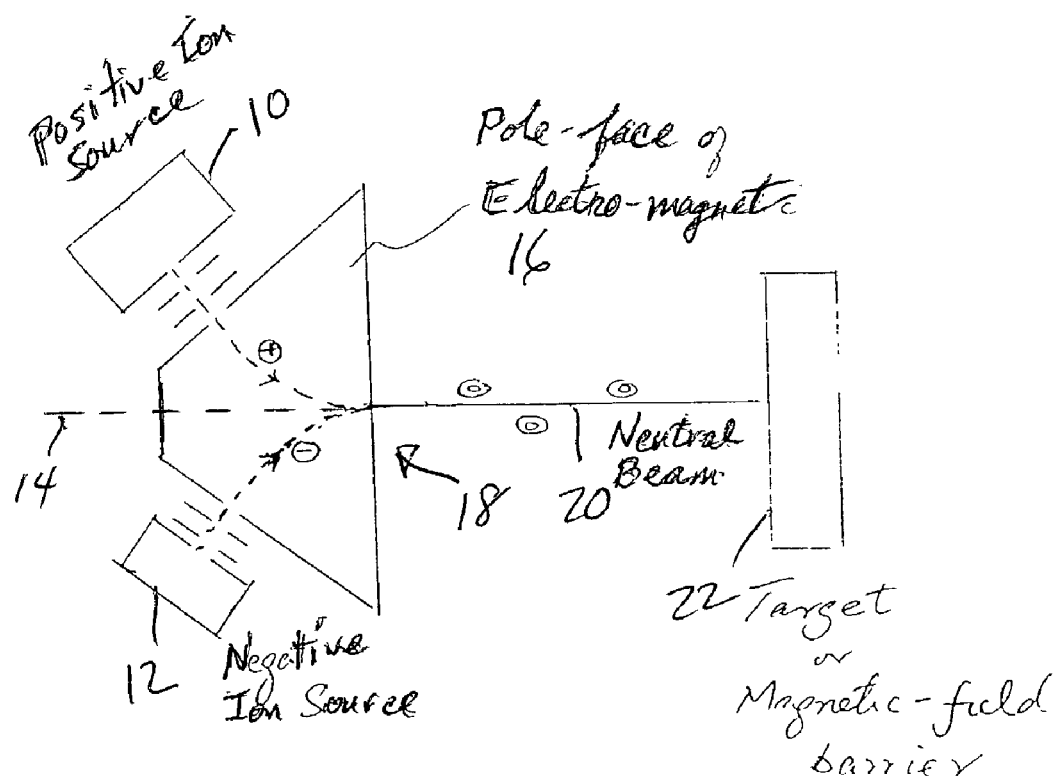
FIG. 1 is a schematic diagram of the positive and negative ion beam merging system of the invention.

As shown in FIG. 1, positive ion source 10 and negative ion source 12 are positioned symmetrically at equal angles on opposite sides of neutral beam axis 14.

Positive and negative ions of the same species and the same energy are extracted from sources 10, 12 and directed into a bending magnetic field region 18, which is typically produced by an electromagnet 16. Because of the opposite charges on the ions from the two sources 10, 12, all the ions from sources 10, 12 bend toward axis 14 and combine to form a single neutral beam 20 which is directed to a target (or magnetic field barrier) 22.

As positive and negative ions from sources 10, 12 pass through bending magnetic field region 18 between the pole faces of electromagnet 16, coming from mirror image positions on opposite sides of beam axis 14, and since the masses and energies of the positive and negative ions are identical, they will have the same Larmor radii. Thus the trajectories will be symmetrical and the positive and negative ion beams will merge into a single neutral beam 20 as they leave the pole face of the electromagnet 16.

Figure 2:
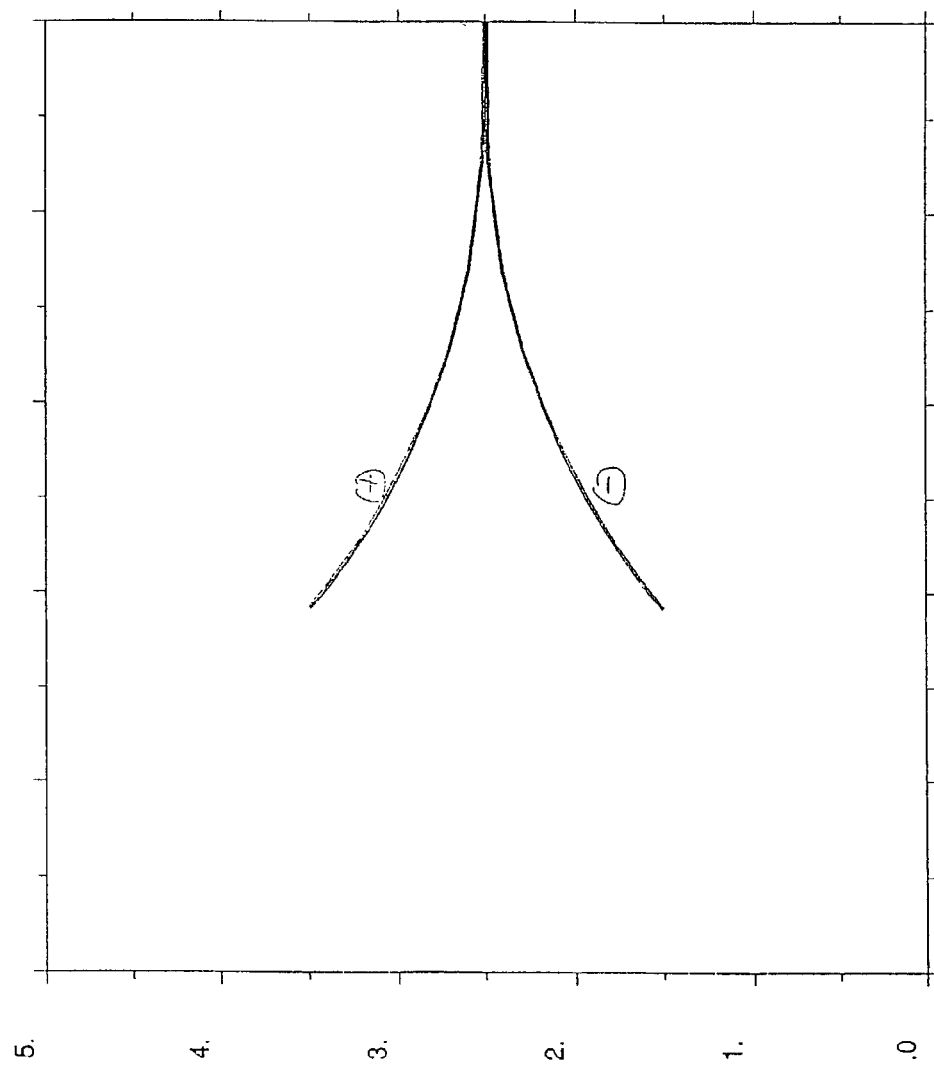
FIGS. 2, 3 are 2-D and 3-D views, respectively, of the ion beam trajectories between the magnetic pole faces.
Figure 3:
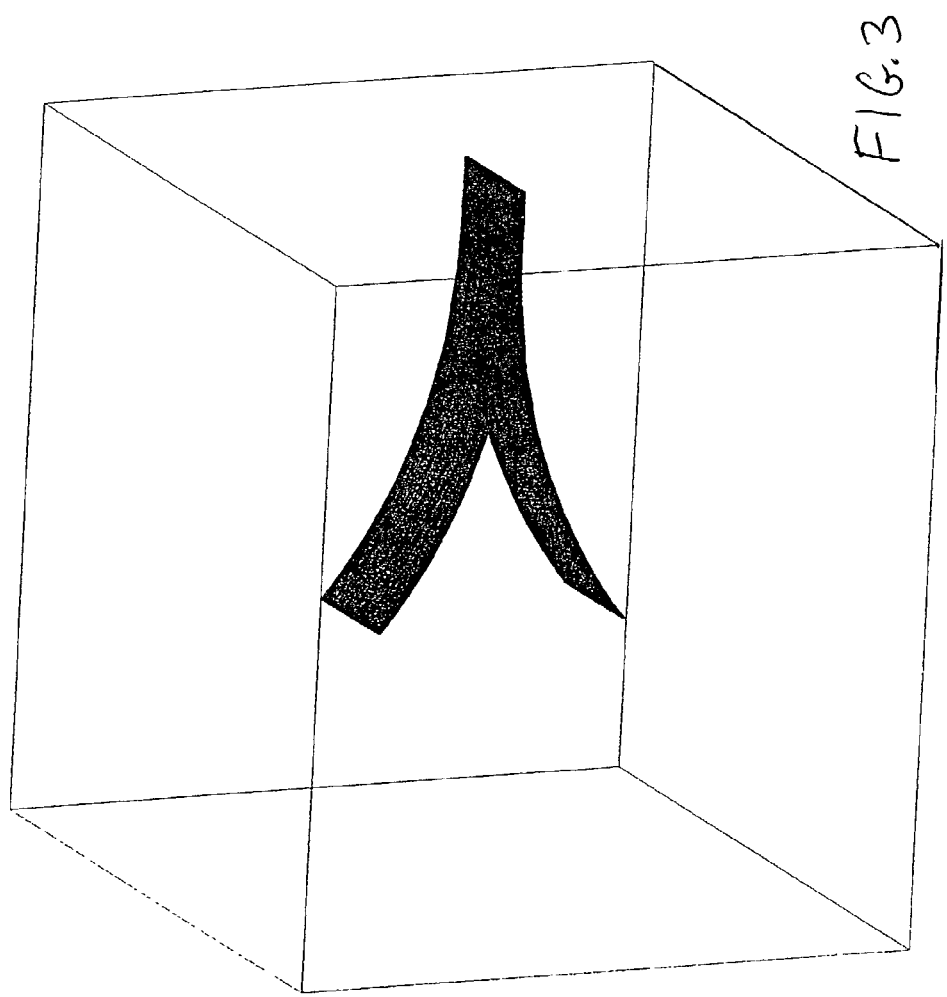
Figure 4:
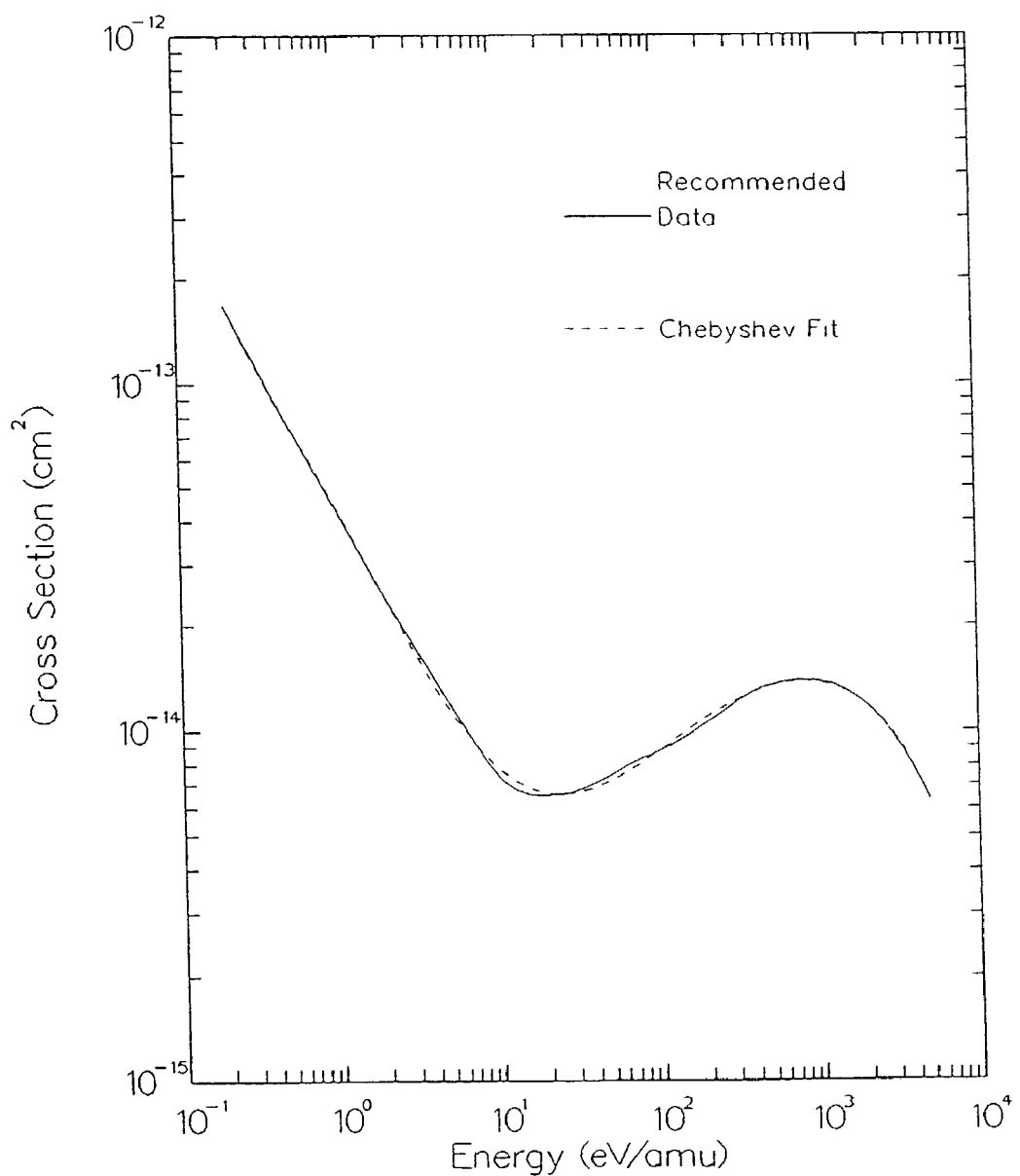
FIG. 4 shows cross-section vs. energy for mutual neutralization of $H^+$ and $H^-$ ions.

The beam trajectories between the pole faces of the electromagnet are illustrated in FIGS. 2, 3. As the beams leave the electromagnet, the positive and negative ions will travel with the same velocity. Since the positive and negative ions have a very low relative velocity, the chance for mutual neutralization, i.e. electrons leave the negative ions and jump into the positive ions, is very high. For example, the cross-section for mutual neutralization of $H^+$ and $H^-$ ions at low relative velocity is as high as $10^{-12}$ cm$^2$ as shown in FIG. 4. Thus, both the positive and negative ion beams will not travel very far before the majority of the ions are converted into neutrals.

The advantages of this beam merging system are: (1) The current can be very high for low energy beam transport because the total current on the target is the sum of the positive and negative ion beam currents. (2) In the case of ion implantation, the target will not charge up to high positive or negative voltages and therefore the use of a plasma neutralizer is not necessary. (3) For mutual neutralization, no gas is needed in the beam transport section. A lot of pumping can be used and no neutralizing cell is needed.

Ion sources 10, 12 are preferably plasma ion sources. The principles of plasma ion sources are well known in the art. Conventional multicusp ion sources are illustrated by U.S. Pat. Nos. 4,793,961; 4,447,732; 5,198,677; 6,094,012, which are herein incorporated by reference. A wide variety of ion species may be produced. For fusion applications, $D^+$ and $D^-$ ions (or $T^+$ and $T^-$) may be used. In ion implantation applications, $B^+$ and $B^-$ or $P^+$ and $P^-$ or other compound ions such as $BF^+$ and $BF^-$ or $BF_2^+$ and $BF_2^-$ may be used.

To increase the current from an ion source, one generally has to increase the density of the plasma inside the ion source chamber. There is a limit to the current density that can be produced. The limit can arise from the limitation of input discharge power or in the production process (as in the case of negative ions).

Figure 5A:
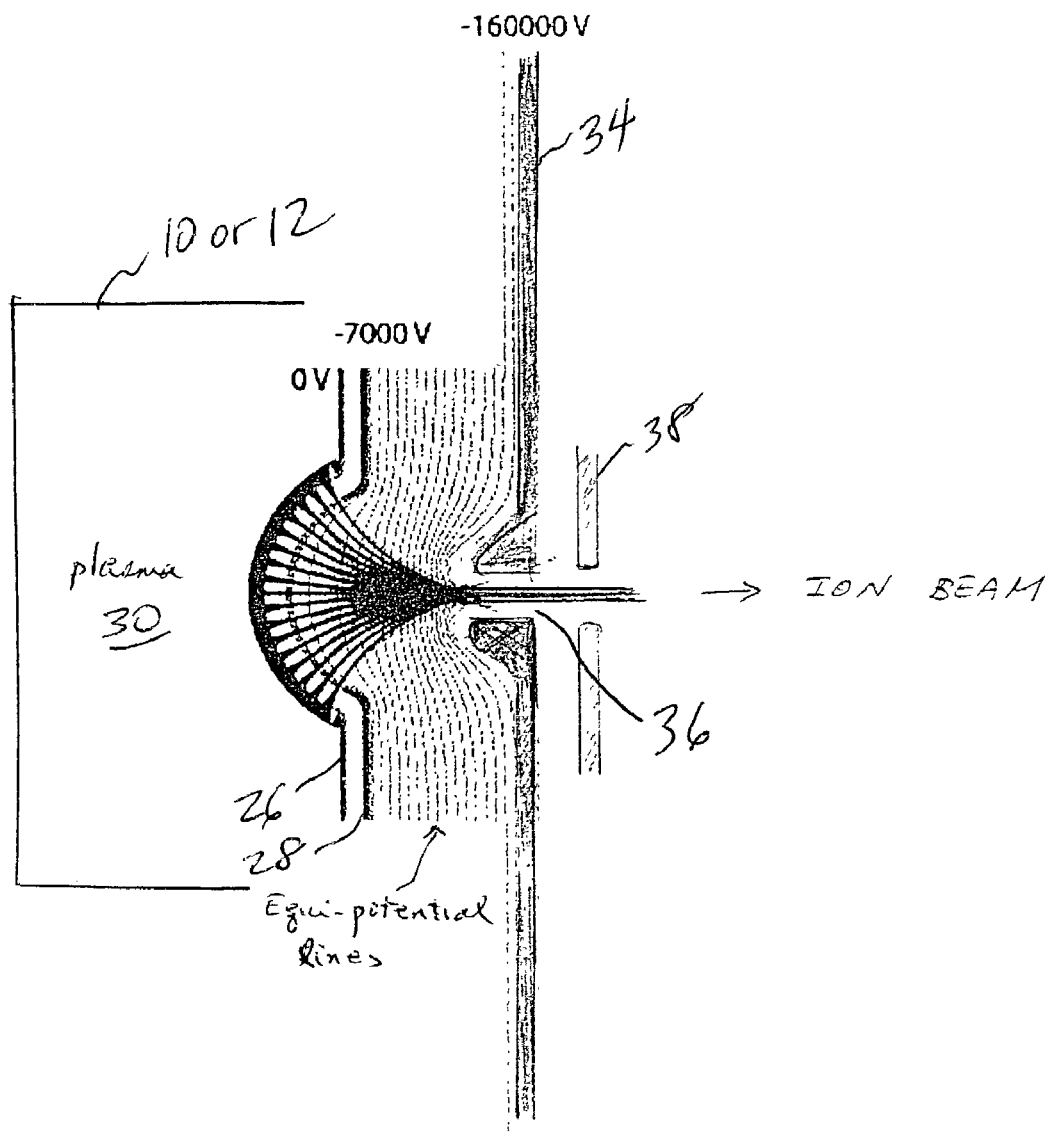
FIGS. 5A, B illustrate an extraction system for multicusp plasma sources for enhancing output ion current.

FIGS. 5A, B illustrate an extraction system for multicusp plasma sources in which the output ion current from a source with normal plasma density is much enhanced. This type of source can produce large areas of uniform plasma. Multi-beamlets are extracted from this extended area through holes or slits in a curved surface. The extraction voltage is low (several kV) and the beamlets merge together at the high voltage electrode. From that point on the beam is compressed and becomes parallel. It can be further accelerated to higher energy or transported to a bending magnet (e.g. electromagnet 16 in FIG. 1) or other accelerator structure. This beam extraction system can easily amplify the output current by an order of magnitude. It can be applied to both positive and negative ion beams, and thus can be used with sources 10, 12 in the system shown in FIG. 1.

As shown in FIG. 5A, ion sources 10, 12 may include a pair of spaced electrodes, plasma electrode 26 and extraction electrode 28, at one end thereof. Electrodes 26, 28 electrostatically control the passage of ions from plasma 30 out of ion sources 10, 12. Electrodes 26, 28 are substantially spherical or curved in shape (e.g. they are a portion of a sphere, e.g. a hemisphere) and contain many aligned holes 32 (shown more clearly in FIG. 5B) over their surfaces so that ions radiate out of ion sources 10, 12. Suitable extraction voltages are applied to electrodes 26, 28, e.g. plasma electrode 26 is at 0 kV and extraction electrode 28 is at −7 kV, so that positive ions are extracted.

Figure 5B:
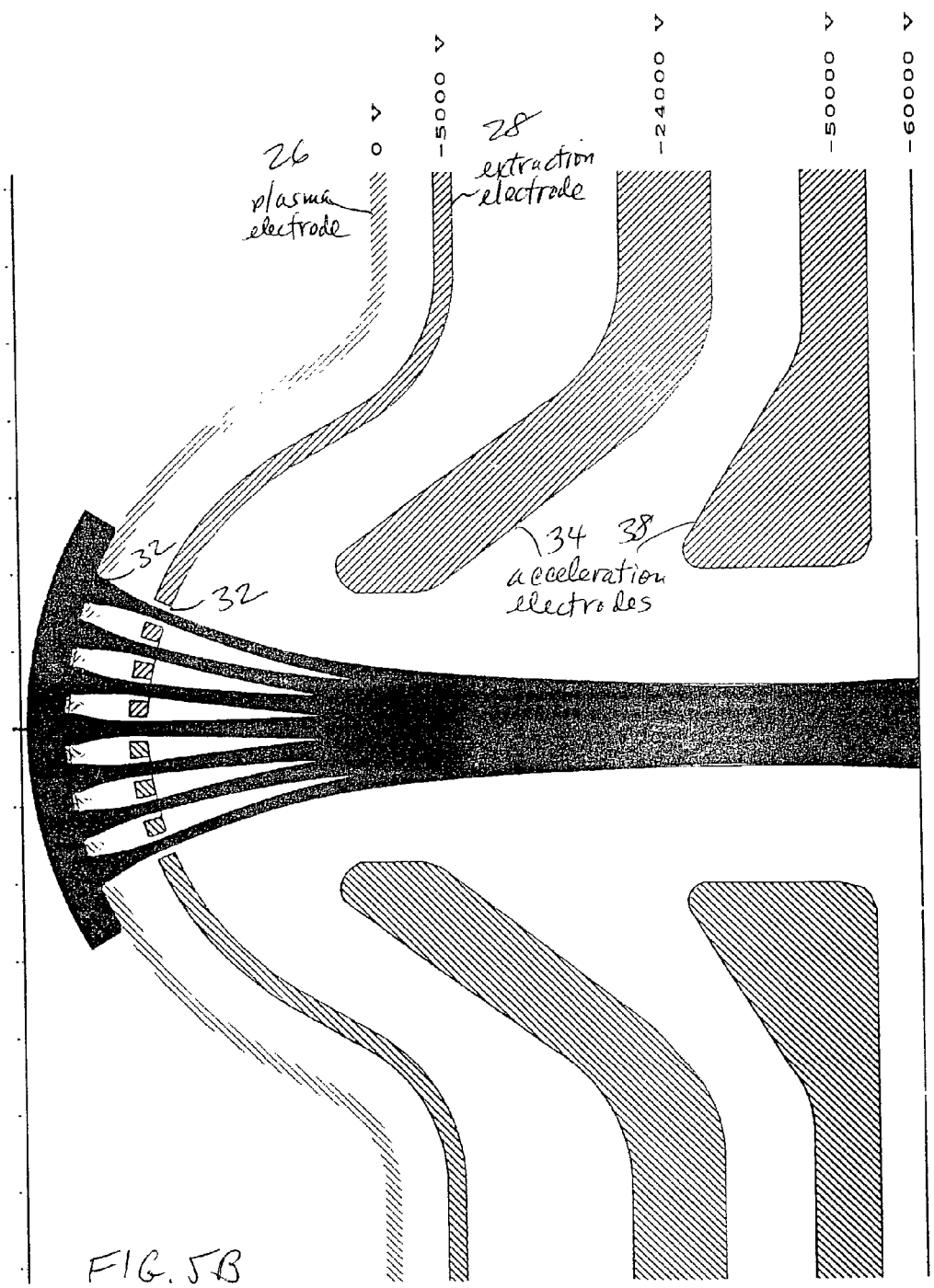

The extraction system of FIG. 5A is followed by a third electrode 34 which contains a central aperture 36 therein. Electrode 34 is at a relatively high negative voltage, e.g. −160 kV, to accelerate the extracted ion beam. More acceleration electrodes, e.g. electrode 38, may also be used. The two electrode extraction system is used to extract a high current ion beam. The spherical shapes of the plasma and extraction electrodes 26, 28 are such that the ion beams (or beamlets) passing through all the holes 32 in electrodes 26, 28 are focused together and the additional electrodes 34, 38 also form a parallel beam. FIG. 5B illustrates another extractor embodiment similar to FIG. 5A with different shaped electrodes 34, 38 and different voltages.

Changes and modifications in the specifically described embodiments can be carried out without departing from the scope of the invention which is intended to be limited only by the scope of the appended claims.

What is claimed is:

1. Apparatus for producing a neutral beam, comprising:
a positive ion source for producing positive ions;
a negative ion source for producing negative ions of the same species as the positive ions;
said positive ion source having an extraction system means for producing a positive ion beam and said negative ion source having an extraction system means for producing a negative ion beam having substantially the same energy and speed as the positive ion beam, and said positive ion source with extraction system means disposed with respect to said negative ion source with extraction system means for producing nonparallel positive and negative ion beams;
a bending magnet disposed to provide a magnetic field region into which the nonparallel beams of positive and negative ions pass;
wherein the positive and negative ion sources with extraction system means are symmetrically positioned with respect to the bending magnet so that the positive and negative ion beams merge together to form a neutral beam.

2. The apparatus of claim 1 wherein the bending magnet comprises an electromagnet having a pair of pole faces, with the bending magnetic field region formed between the pole faces.

3. The apparatus of claim 1 wherein the ion sources are multicusp plasma ion sources.

4. The apparatus of claim 3 wherein the ion sources have multi-aperture extraction systems for increasing ion current from the ion sources.

5. The apparatus of claim 4 wherein the multi-aperture extraction system comprises a pair of spaced curved electrodes having a plurality of aligned apertures therein for extracting multiple beamlets.

6. The apparatus of claim 5 wherein the apertures are holes or slits.

7. The apparatus of claim 5 further comprising a third spaced electrode having a central aperture therein, wherein the beamlets merge together to form a single beam which passes through the third electrode.

8. The apparatus of claim 1 wherein the ion sources are sources of D+ and D− ions or T+ and T− ions for fusion applications.

9. The apparatus of claim 1 wherein the ion sources are sources of B+ and B− ions or P+ and P− ions or BF+ and BF− ions or BF2+ and BF2− ions for ion implantation applications.

* * * * *